United States Patent
Park et al.

(10) Patent No.: US 7,456,088 B2
(45) Date of Patent: Nov. 25, 2008

(54) INTEGRATED CIRCUIT PACKAGE SYSTEM INCLUDING STACKED DIE

(75) Inventors: Soo-San Park, Seoul (KR); Hyeog Chan Kwon, Seoul (KR); Sang-Ho Lee, Kyonggi (KR); Jong-Woo Ha, Seoul (KR)

(73) Assignee: Stats Chippac Ltd., Singapore (SG)

( * ) Notice: Subject to any disclaimer, the term of this patent is extended or adjusted under 35 U.S.C. 154(b) by 365 days.

(21) Appl. No.: 11/306,627

(22) Filed: Jan. 4, 2006

(65) Prior Publication Data

US 2007/0158833 A1 Jul. 12, 2007

(51) Int. Cl.
H01L 21/44 (2006.01)
(52) U.S. Cl. .................... 438/613; 257/737
(58) Field of Classification Search .............. 257/680, 257/686, 701, 705, 707, 777
See application file for complete search history.

(56) References Cited

U.S. PATENT DOCUMENTS

| | | | |
|---|---|---|---|
| 5,607,227 A | 3/1997 | Yasumoto et al. | |
| 5,977,640 A | 11/1999 | Bertin et al. | |
| 6,083,811 A | 7/2000 | Riding et al. | |
| 6,121,682 A | 9/2000 | Kim | |
| 6,130,448 A | 10/2000 | Bauer et al. | |
| 6,143,588 A | 11/2000 | Glenn | |
| 6,144,507 A | 11/2000 | Hashimoto | |
| 6,204,562 B1 | 3/2001 | Ho et al. | 257/777 |
| 6,225,699 B1 | 5/2001 | Ference et al. | |
| 6,266,197 B1 | 7/2001 | Glenn et al. | |
| 6,294,406 B1 | 9/2001 | Bertin et al. | |
| 6,297,131 B1 | 10/2001 | Yamada et al. | |
| 6,369,454 B1 | 4/2002 | Chung | 257/787 |
| 6,396,116 B1 | 5/2002 | Kelly et al. | |
| 6,407,381 B1 | 6/2002 | Glenn et al. | |
| 6,420,244 B2 | 7/2002 | Lee | 438/458 |
| 6,455,353 B2 | 9/2002 | Lin | 438/113 |
| 6,534,419 B1 | 3/2003 | Ong | |
| 6,707,140 B1 | 3/2004 | Nguyen et al. | 257/686 |
| 6,828,665 B2 | 12/2004 | Pu et al. | |
| 6,881,611 B1 | 4/2005 | Fukasawa et al. | |
| 6,900,079 B2 * | 5/2005 | Kinsman et al. | 438/127 |
| 6,900,528 B2 | 5/2005 | Mess et al. | |
| 6,900,549 B2 | 5/2005 | Brooks | |
| 6,906,415 B2 | 6/2005 | Jiang et al. | |
| 6,906,416 B2 | 6/2005 | Karnezos | |
| 6,930,378 B1 | 8/2005 | St. Amand et al. | |
| 6,930,396 B2 | 8/2005 | Kurita et al. | |
| 6,933,598 B2 | 8/2005 | Karnezos | |
| 6,951,982 B2 | 10/2005 | Chye et al. | |
| 6,972,481 B2 | 12/2005 | Karnezos | |
| 7,034,387 B2 | 4/2006 | Karnezos | |
| 7,034,388 B2 | 4/2006 | Yang et al. | |
| 7,045,887 B2 | 5/2006 | Karnezos | |
| 7,049,691 B2 | 5/2006 | Karnezos | |
| 7,053,476 B2 | 5/2006 | Karnezos | |
| 7,053,477 B2 | 5/2006 | Karnezos et al. | |

(Continued)

*Primary Examiner*—Roy K Potter
(74) *Attorney, Agent, or Firm*—Mikio Ishimaru

(57) ABSTRACT

An integrated circuit package system is provided including providing a wafer with bond pads formed on the wafer. A solder bump is deposited on one or more bond pads. The bond pads and the solder bump are embedded within a mold compound formed on the wafer. A groove is formed in the mold compound to expose a portion of the solder bump. The wafer is singulated into individual die structures at the groove.

10 Claims, 3 Drawing Sheets

U.S. PATENT DOCUMENTS

| | | |
|---|---|---|
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,081,678 B2 | 7/2006 | Liu |
| 7,084,500 B2 | 8/2006 | Swnson et al. |
| 7,090,482 B2 | 8/2006 | Tsukahara et al. |
| 7,093,358 B2 | 8/2006 | Akram et al. |
| 7,101,731 B2 | 9/2006 | Karnezos |
| 7,109,574 B2 | 9/2006 | Chiu et al. |
| 7,115,990 B2 | 10/2006 | Kinsman |
| 7,119,427 B2 | 10/2006 | Kim |
| 7,122,906 B2 | 10/2006 | Doan |
| 7,176,506 B2 | 2/2007 | Beroz et al. |
| 7,183,191 B2 * | 2/2007 | Kinsman et al. ............ 438/613 |
| 7,218,005 B2 | 5/2007 | Tago |
| 7,221,059 B2 | 5/2007 | Farnworth et al. |
| 7,298,045 B2 | 11/2007 | Fujitani et al. |
| 7,335,994 B2 | 2/2008 | Klein et al. |
| 2002/0024124 A1 | 2/2002 | Hashimoto |
| 2002/0096755 A1 | 7/2002 | Fukui et al. |
| 2002/0100955 A1 | 8/2002 | Potter et al. |
| 2002/0130404 A1 | 9/2002 | Ushijima et al. |
| 2003/0008510 A1 | 1/2003 | Grigg et al. |
| 2003/0113952 A1 | 6/2003 | Sambasivam et al. |
| 2003/0153134 A1 | 8/2003 | Kawata et al. |
| 2004/0016939 A1 | 1/2004 | Akiba et al. |
| 2004/0061213 A1 | 4/2004 | Kazemos |
| 2004/0119153 A1 | 6/2004 | Kazemos |
| 2004/0124540 A1 | 7/2004 | Chen et al. |
| 2004/0166605 A1 | 8/2004 | Kuratomi et al. |
| 2004/0201087 A1 | 10/2004 | Lee |
| 2004/0212096 A1 | 10/2004 | Wang |
| 2005/0051882 A1 | 3/2005 | Kwon et al. |
| 2005/0075053 A1 | 4/2005 | Jung |
| 2006/0043556 A1 | 3/2006 | Su et al. |

* cited by examiner

INTEGRATED CIRCUIT PACKAGE SYSTEM INCLUDING STACKED DIE

CROSS-REFERENCE TO RELATED APPLICATION(S)

The present application contains subject matter related to concurrently filed U.S. patent application by Seng Guan Chow and Heap Hoe Kuan entitled "Multichip Package System" which is identified by Ser. No. 11/326,211. The related application is assigned to STATS ChipPAC Ltd. and the subject matter thereof is incorporated herein by reference thereto.

The present application contains subject matter also related to concurrently filed U.S. patent application by Seng Guan Chow and Heap Hoe Kuan entitled "Image Sensor Package System" which is identified by Ser. No. 11/326,206. The related application is assigned to STATS ChipPAC Ltd. and the subject matter thereof is incorporated herein by reference thereto.

The present application contains subject matter also related to concurrently filed U.S. patent application by Il Kwon Shim, Byung Joon Han, Kambhampati Ramakrishna, and Seng Guan Chow entitled "Encapsulant Cavity Integrated Circuit Package System" which is identified by Ser. No. 11/306,628. The related application is assigned to STATS ChipPAC Ltd. and the subject matter thereof is incorporated herein by reference thereto.

TECHNICAL FIELD

The present invention relates generally to integrated circuit package systems, and more particularly to an integrated circuit package system including stacked die.

BACKGROUND ART

In the electronics industry, as products such as cell phones and camcorders become smaller and smaller, increased miniaturization of integrated circuit (IC) packages has become more and more critical. At the same time, higher performance and lower cost have become essential for new products.

Usually, many individual integrated circuit devices are constructed on the same wafer and groups of integrated circuit devices are separated into individual integrated circuit die.

One approach to putting more integrated circuit dies in a single package involves stacking the dies with space between the dies for wire bonding. The space is achieved by means of a thick layer of organic adhesive or in combination with inorganic spacers of material such as silicon (Si), ceramic, or metal. Unfortunately, the stacking adversely affects the performance of the package because of decreased thermal performance due to the inability to remove heat through the organic adhesive and/or inorganic spacers. As the number of dies in the stack increases, thermal resistance increases at a faster rate. Further, such stacked dies have a high manufacturing cost.

Generally, semiconductor packages are classified into a variety of types in accordance with their structures. In particular, semiconductor packages are classified into an in-line type and a surface mount type in accordance with their mounting structures. Examples of in-line type semiconductor packages include a dual in-line package (DIP) and a pin grid array (PGA) package. Examples of surface mount type semiconductor packages include quad flat package (QFP) and a ball grid array (BGA) package.

Recently, the use of surface mount type semiconductor packages has increased, as compared to in-line type semiconductor packages, in order to obtain an increased element mounting density of a printed circuit board. A conventional semiconductor package has a size considerably larger than that of the semiconductor chip used. For this reason, this semiconductor package cannot meet the recent demand for a light, thin, simple, miniature structure. As a result, it is hard for the conventional semiconductor package to meet the demand for a highly integrated miniature structure.

Furthermore, the fabrication method used to fabricate the conventional semiconductor package involves a relatively large number of processes. For this reason, a need therefore exists for reducing the costs through use of simplified processes. In view of the ever-increasing need to save costs and improve efficiencies, it is more and more critical that answers be found to these problems.

DISCLOSURE OF THE INVENTION

The present invention provides an integrated circuit package system including providing a wafer with bond pads formed on the wafer. A solder bump is deposited on one or more bond pads. The bond pads and the solder bump are embedded within a mold compound formed on the wafer. A groove is formed in the mold compound to expose a portion of the solder bump. The wafer is singulated into individual die structures at the groove.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
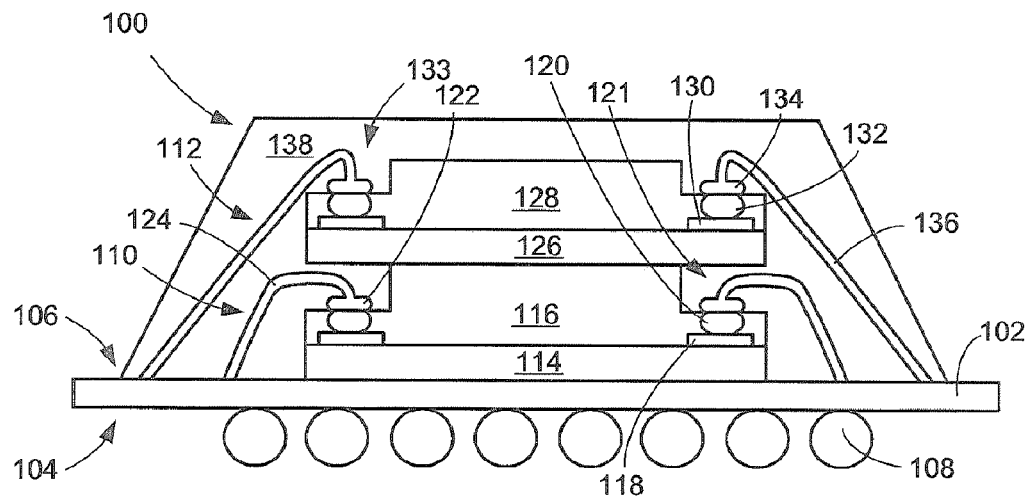
FIG. 1 is a cross-sectional view of an integrated circuit package system in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs.

Generally, the device can be operated in any orientation. The same numbers are used in all the drawing FIGs. to relate to the same elements.

The term "horizontal" as used herein is defined as a plane parallel to the conventional plane or surface of the wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in accordance with an embodiment of the present invention. A printed circuit board 102 (PCB) has a first surface 104 and a second surface 106 opposite to the first surface 104. Solder balls 108 are disposed against the first surface 104. A first semiconductor structure 110 is coupled to the second surface 106 of the printed circuit board 102. A second semiconductor structure 112 is stacked on top of the first semiconductor structure 110.

The first semiconductor structure 110 includes a die 114 having a mold compound 116. The die 114 has bond pads 118 electrically connected to the integrated circuits (not shown) within the die 114. The mold compound 116 includes solder bumps 120 bonded to the bond pads 118, and a recess 121 formed into the edges of the mold compound 116.

The recess 121 partially expose the solder bumps 120. Electrical connectors, including wire bonds 122 and bond wires 124, couple the solder bumps 120 to the printed circuit board 102. The height of the recess 121 is tall enough to provide a clearance for the electrical connectors disposed underneath the second semiconductor structure 112. The wire bonds and a portion of the bond wires are located within the recess 121. The combined height of the mold compound 116 and the die 114 is greater than the height of the electrical connectors.

The second semiconductor structure 112 includes a die 126 having a mold compound 128. A bottom surface of the die 126 is coupled to a top surface of the mold compound 116 of the first semiconductor structure 110. The die 126 has bond pads 130 electrically connected to the integrated circuits (not shown) within the die 126. The mold compound 128 includes solder bumps 132 bonded to the bond pads 130, and a recess 133 formed into the edges of the mold compound 128. The recess 133 partially exposes the solder bumps 132. Electrical connectors, including wire bonds 134 and bond wires 136, couple the solder bumps 132 to the printed circuit board 102.

The recesses 121 and 133 can be on two sides of the first and second semiconductor structures 110 and 112 or on all four sides for quad-packages. The first and second semiconductor structures 110 and 112 can be subsequently encapsulated in an encapsulant 138 to protect the bond wires 124 and 136 and to form the integrated circuit package system 100 with a low profile.

Figure 2:
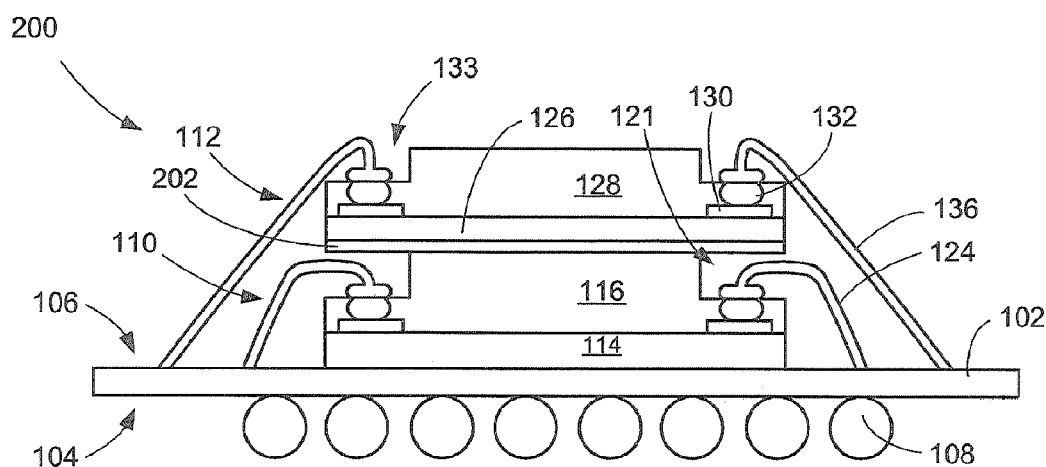
FIG. 2 is a cross-sectional view of an integrated circuit package system in accordance with another embodiment of the present invention.

Referring now to FIG. 2, therein is shown a cross-sectional view of an integrated circuit package system 200 in accordance with another embodiment of the present invention. The integrated circuit package system 200 includes a similar structure to the integrated circuit package system 100. In addition, a layer of film laminate 202 is applied between the top surface of the mold compound 116 of the first semiconductor structure 110 and the bottom surface of the die 126 of the second semiconductor structure 112. The layer of film laminate 202 provides insulation between the first and second semiconductor structures 110 and 112, and may act as an adhesive material.

The recesses 121 and 133 can be on two sides of the first and second semiconductor structures 110 and 112 or on all four sides for quad-packages. The first and second semiconductor structures 110 and 112 can be subsequently encapsulated to protect the bond wires 124 and 136 and to form the integrated circuit package system 200 with a low profile.

Figure 3A:
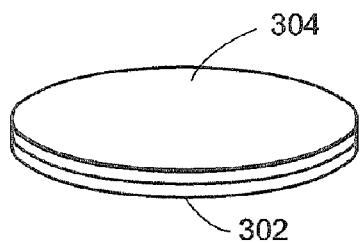
FIG. 3A is a perspective view of a wafer in a bumped step in accordance with an embodiment of the present invention.

Referring now to FIG. 3A, therein is shown a perspective view of a wafer 302 in a bumped and mold step in accordance with an embodiment of the present invention. A mold compound 304 is applied on the wafer 302. The mold compound 304 may be spun-on, poured within a rim barrier, injected in a mold, or otherwise applied.

Figure 3B:
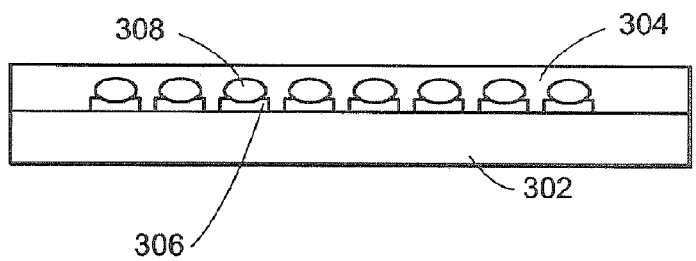
FIG. 3B is a cross-sectional view of a wafer in a bumped step as in FIG. 3A.

Referring now to FIG. 3B, therein is shown a cross-sectional view of the wafer 302 in a bumped and mold step as in FIG. 3A. Bond pads 306 are formed on the wafer 302 in connection with the integrated circuits (not shown) in the wafer 302. Solder bumps 308 are then deposited on the bond pads 306 followed by the deposition of the mold compound 304.

Figure 4:
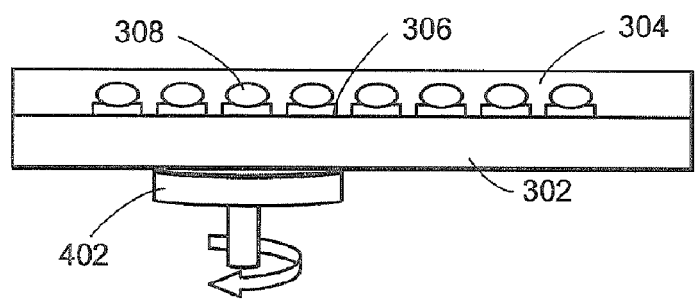
FIG. 4 is the structure of FIG. 3B in a grinding step in accordance with an embodiment of the present invention.

Referring now to FIG. 4, therein is shown the structure of FIG. 3B in a grinding step in accordance with an embodiment of the present invention. The bottom, exposed surface of the wafer 302 is planarized to a specified surface flatness and thickness. In accordance with one embodiment, the surface is planarized by grinding using a grinding wheel 402.

The planarization permits the dies 124 and 126 to be extremely thin but partially supported for strength by the mold compounds 116 and 128 so they may be safely handled. This extreme thinness also helps reduce the package profile. Furthermore, the planarization allows for better accuracy for the following sawing step.

Figure 5:
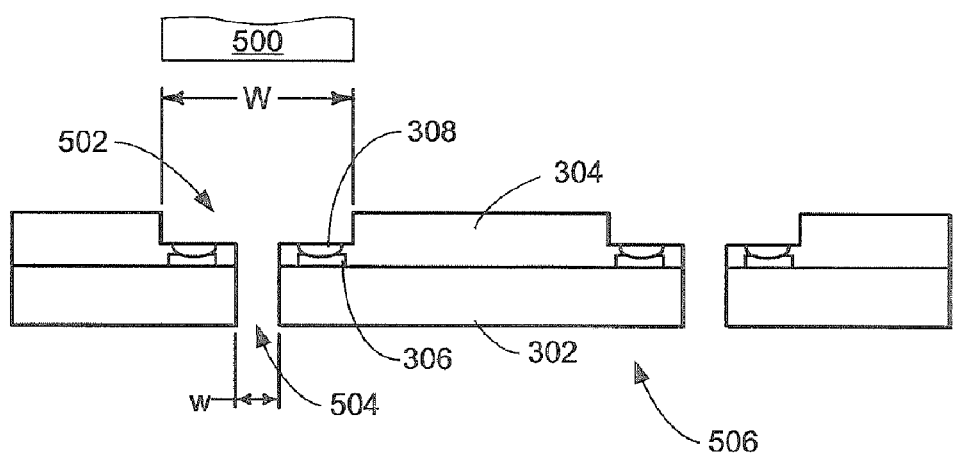
FIG. 5 is the structure of FIG. 4 in a sawing step in accordance with an embodiment of the present invention.

Referring now to FIG. 5, therein is shown the structure of FIG. 4 in a sawing step in accordance with an embodiment of the present invention. A portion of the wafer 302 and the mold compound 304 are cut. For example, a thick blade 500 may be used for creating a groove 502 of width "W" on a portion of the surface of the mold compound 304 such that it exposes a portion of the solder bumps 308. A dicing saw may be used for cutting the wafer 302 and the mold compound 304 to create a cut 504 of width "w" between each die structure to yield an integrated circuit package 506.

The groove 502 reduces the thickness of the mold compound 304, which must be sawn, while the mold compound 304 helps prevent defects during the dicing operation.

Figure 6:
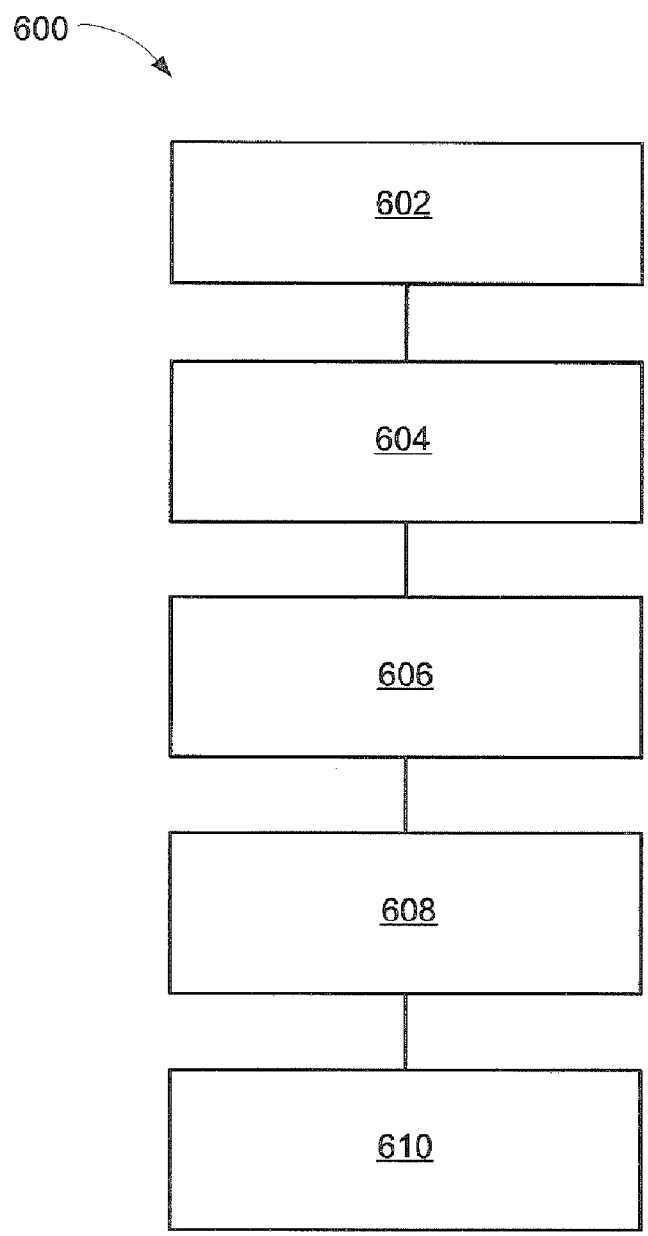
FIG. 6 is a flow chart of an integrated circuit package system in accordance with an embodiment of the present invention.

Referring now to FIG. 6, therein is shown a flow chart of an integrated circuit package system 600 for manufacturing the system 100 in accordance with an embodiment of the present invention. The system 600 includes providing a wafer with bond pads formed on the wafer in a block 602; depositing solder bumps on one or more bond pads in a block 604; embedding the bond pads and the solder bumps within a mold compound on the wafer in a block 606; forming a groove in the mold compound to expose a portion of the solder bumps in a block 608; and singulating the wafer at the groove into individual die structures in a block 610.

In greater detail, an integrated circuit package system including stacked die, according to an embodiment of the present invention, is performed as follows:

(1) 1. providing the wafer 302. (FIG. 3A)
(2) 2. applying the layer of mold compound 304 on the wafer 302. (FIG. 3B)
(3) 3. forming bond pads 306 on the wafer 302 in connection with the integrated circuits in the wafer 302. (FIG. 3B)

(4) 4. depositing solder bumps 308 on the bond pads 306 (FIG. 3B)

(5) 5. depositing the mold compound 304. (FIG. 3B)

(6) 6. planarizing the bottom, exposed surface of the wafer 302 to a specified surface flatness and thickness. (FIG. 4)

(7) 7. forming the groove 502 of width "W" on a portion of the surface of the layer of mold compound 304 such that it exposes a portion of the solder bump 308. (FIG. 5)

(8) 8. cutting through the wafer 302 and the remaining layer of the mold compound 304 to create the cut 504 of width "w" between each die structure to yield the integrated circuit package 506. (FIG. 5)

It has been discovered that the present invention thus has numerous aspects.

An aspect of the present invention is that it valuably supports and services the historical trend of reducing costs, simplifying systems, and increasing performance.

These and other valuable aspects of the present invention consequently further the state of the technology to at least the next level.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   providing a wafer with bond pads formed on the wafer;
   depositing a solder bump on one or more bond pads;
   embedding the bond pads and the solder bump within a mold compound formed on the wafer;
   forming a groove in the mold compound to expose a portion of the solder bump; and
   singulating the wafer at the groove into individual die structures.

2. The system as claimed in claim 1 wherein forming the groove further comprises:
   removing a top portion of the mold compound and a top portion of a solder bump associated with a bond pad.

3. The system as claimed in claim 2 further comprising:
   exposing the top portion of two adjacent solder bumps.

4. The system as claimed in claim 1 wherein singulating further comprises:
   cutting the wafer and the mold compound between two adjacent bond pads.

5. The system as claimed in claim 1 further comprising:
   planarizing the bottom exposed surface of the wafer.

6. The system as claimed in claim 1 further comprising:
   providing a printed circuit board; and
   connecting the exposed portion of the solder bump to the printed circuit board with electrical connectors,
   wherein a combined height of the mold compound and the wafer is at least greater than a height of the electrical connectors.

7. The system as claimed in claim 6 further comprising:
   stacking a second semiconductor structure on the mold compound; and
   connecting the second semiconductor structure to the printed circuit board.

8. The system as claimed in claim 6 further comprising:
   encapsulating the wafer, the mold compound, and the electrical connectors with an encapsulant.

9. The system as claimed in claim 7 further comprises:
   providing a layer of film laminate on the mold compound and under the second semiconductor structure.

10. The system as claimed in claim 6 further comprising:
    forming solder balls on the bottom surface of the printed circuit board.

* * * * *